United States Patent [19]

Ohsawa

[11] Patent Number: 4,973,897
[45] Date of Patent: Nov. 27, 1990

[54] SYSTEM-ANALYZER
[75] Inventor: Mitsuo Ohsawa, Kanagawa, Japan
[73] Assignee: Sony Corporation, Tokyo, Japan
[21] Appl. No.: 353,487
[22] Filed: May 18, 1989
[30] Foreign Application Priority Data
May 24, 1988 [JP] Japan .................................. 126680
[51] Int. Cl.⁵ .......................................... G01R 23/16
[52] U.S. Cl. ................................ 324/77 B; 324/77 E; 381/103
[58] Field of Search ........................... 381/98, 103, 51; 324/77 R, 77 B, 77 C, 77 CS, 77 D, 77 E, 77 F, 77 G, 78 R, 78 F, 78 E, 79 D; 360/84, 32, 36.2; 340/825.03; 364/483, 550; 455/345, 202, 205, 47, 63

[56] References Cited
U.S. PATENT DOCUMENTS 4,464,781 8/1984 Kaneko .................................. 381/98
4,504,968 3/1985 Kaneko .............................. 324/77 E
4,612,665 9/1986 Inami .................................. 381/103
4,661,982 4/1987 Kitazato .............................. 381/103
4,688,258 8/1987 Kunugi ................................ 381/103

Primary Examiner—Michael J. Tokar
Attorney, Agent, or Firm—Alvin Sinderbrand

[57] ABSTRACT

In a spectrum analyzer, an input signal is divided into a plurality of frequency bands, the signal level of each of the divided frequency bands is detected, and the signal levels of frequency bands situated between the divided frequency bands are calculated, for example, by arithmetic operating circuits, from the detected signal levels of the divided frequency bands adjacent thereto, whereupon the detected signal levels of the divided frequency bands and the calculated signal levels of the frequency bands between the divided frequency bands are all displayed, for example, as respective bar graphs, so that the frequency characteristic of the input signal can be readily observed.

11 Claims, 4 Drawing Sheets

SYSTEM ANALYZER

BACKGROUND OF THE INVENTION

1. Field of the Invention

This invention relates generally to a spectrum analyzer and, more particularly, is directed to a spectrum analyzer which is particularly suited for use in a graphic equalizer.

2. Description of the Prior Art

When reproducing an audio signal in a special sound field, such as, in an automobile, it is known to compensate for the sound field by employing a graphic equalizer, for example, as shown in the Japanese Published Patent Application No. 86913/1984. In such a graphic equalizer, the reproduced audio signal is divided into a number of frequency bands, and the signal levels of the divided bands are adjusted relative to each other so as to compensate for the sound field. A graphic equalizer of the described type usually has a spectrum analyzer associated therewith for displaying the signal levels of the several frequency bands in the form of respective bar graphs. In that case, as the signal levels of the several frequency bands are adjusted, the relationship of the adjusted signal levels can be ascertained by observing the bar graphs of the spectrum analyzer.

A spectrum analyzer providing bar graph displays of the signal levels of the several frequency bands in a conventional graphic equalizer is shown in FIG. 1 to include an input terminal 51 from which an input signal, for example, an audio signal reproduced from a tape cassette, is supplied to a multiband band-pass filter circuit 52. The multiband band-pass filter circuit 52 comprises a plurality of band-pass filters 52A–52J having respective pass bands with different center frequencies. More specifically, in the illustrated example of the prior art, the ten band-pass filters 52A–52J making up the multiband band-pass filter circuit 52 have center frequencies $F_{11}$–$F_{20}$, respectively. Thus, the audio signal from the input terminal 51 is divided by the multiband band-pass filter circuit 52 into ten components or frequency bands which are respectively centered about the frequencies $F_{11}$–$F_{20}$.

Outputs of the band-pass filters 52A–52J are supplied to detecting circuits 53A–53J, respectively, which detect the signal levels of the ten frequency components or bands having the
frequencies $F_{11}$–$F_{20}$, respectively. The detected signal level outputs from the detecting circuits 53A–53J are supplied to A/D converters 54A–54J, respectively, which provide digital data representing the signal levels of the frequency bands having the center frequencies $F_{11}$–$F_{20}$, respectively. The digital data from the A/D converters 54A–54J are supplied to decoders 55A–55J, respectively, and each of the decoders 55A–55J converts the digital data supplied thereto and representing the signal level of a respective divided frequency band of the input signal into a decoded signal corresponding to one of a predetermined number, for example, thirteen, of steps or increments corresponding to respective dots or elements of an associated bar graph. The decoded outputs from the decoders 55A–55J are supplied through a driver 56 to a display device 57.

Such display device 57 may conventionally be in the form of a liquid crystal display (LCD) having a column of dots for each of the frequency bands into which the input signal is divided by the band-pass filter circuit 52, with each such column having a number of dots therein corresponding to the number of increments or steps into which each of the decoders 55A–55J converts the respective digital data from the A/D converter 54A–54J. Thus, in the illustrated spectrum analyzer according to the prior art, the LCD display 57 includes ten vertically extending columns $l_{21}$–$l_{30}$ arranged in a horizontal series and each comprised of thirteen dots which are selectively excited, starting from the bottom of the respective column, for defining a bar graph representing the signal level of the respective frequency band divided from the input signal.

It will be appreciated that, with the spectrum analyzer according to the prior art as shown in FIG. 1, the adjusted levels of the several frequency components divided by the multiband band-pass filter circuit 52 so as to have center frequencies $F_{11}$–$F_{20}$ are detected by the detecting circuits 53A–53J and then respectively displayed by the columns $l_{21}$–$l_{30}$ of LCD dots or elements, as represented by the shaded areas on FIG. 1. Thus, in the illustrated example of the prior art, the input signal is divided into ten frequency components having the center frequencies $F_{11}$–$F_{20}$, respectively, and the signal levels of the ten frequency bands are displayed by the ten bar graphs defined by the columns $l_{21}$–$l_{30}$, respectively, of the display device 57. When fine adjustment of the frequency characteristic of an audio or other signal applied as the input to the terminal 51 is to be effected, it is desirable to increase the number of frequency bands which have their signal levels indicated by the display device 57. In other words, when only a relatively small number of frequency bands have their signal levels indicated by the display device 57, the displays of the frequency band levels are and it is difficult to visualize an image of the resulting frequency characteristic. If the number of frequency bands having their signal levels indicated by the display device 57 is increased, a curve representing the frequency characteristic of the reproduced audio signal can be more easily visualized from the increased number of bar graphs defined by the display 57.

However, in the spectrum analyzer of the prior art, the number of frequency bands or components which have their signal levels indicated by the display device 57 corresponds to the number of frequency bands divided by the multiband band-pass filter circuit 52. Therefore, in order to increase the number of frequency bands which are to have their signal levels indicated by the display device 57, it is necessary to correspondingly increase the number of band-pass filters included in the filter circuit 52. For example, in order to permit the signal levels of nineteen frequency bands or components to be displayed, it would be necessary to provide nineteen band-pass filters in the filter circuit 52. Furthermore, it would be necessary to similarly increase the numbers of detecting circuits, A/D converters and decoders provided in succession after the nineteen band-pass filters, respectively. Therefore, in the spectrum analyzer according to the prior art, an increase in the number of frequency bands which are to have their signal levels indicated by the display device 57 is achieved only at the expense of substantially increasing the complexity and cost of the associated circuit.

OBJECTS AND SUMMARY OF THE INVENTION

Accordingly, it is an object of this invention to provide a spectrum analyzer in which the number of frequency components or bands of the input signal which have their levels displayed can be increased without substantially increasing the complexity and cost of the associated circuit.

In accordance with an aspect of this invention, a spectrum analyzer comprises means for dividing an audio or other input signal into a plurality of frequency bands; means for detecting the respective signal levels of the frequency bands into which the input signal is divided; means for determining, from the detected signal levels of the adjacent divided frequency bands, signal levels of frequency bands situated between the adjacent divided frequency bands; and display means for displaying the detected signal levels of the divided frequency bands and also the signal levels which are determined for the frequency bands situated between the divided frequency bands adjacent thereto.

In a desirable embodiment of this invention, the signal levels of the frequency bands situated between the divided frequency bands adjacent thereto are calculated by arithmetic operating means which, for example, calculates the signal level of each of the frequency bands situated between divided frequency bands as the mean value of the signal levels of the divided frequency bands adjacent thereto.

The above, and other objects, features and advantages of the present invention, will be readily apparent in the following detailed description thereof which is to be read in connection with the accompanying drawings.

DETAILED DESCRIPTION OF A PREFERRED EMBODIMENT

Figure 1:
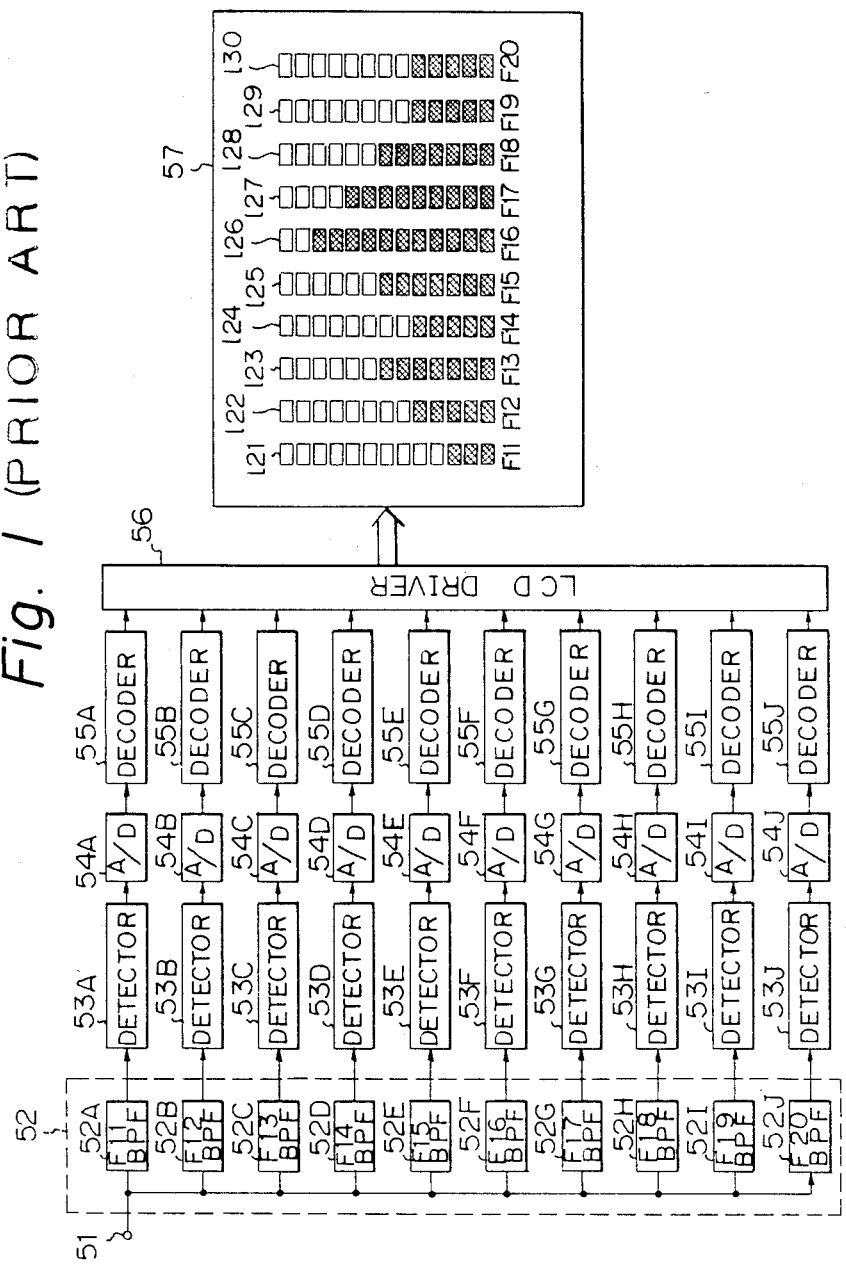
FIG. 1 is a block diagram of a spectrum analyzer according to the prior art.
Figure 2:
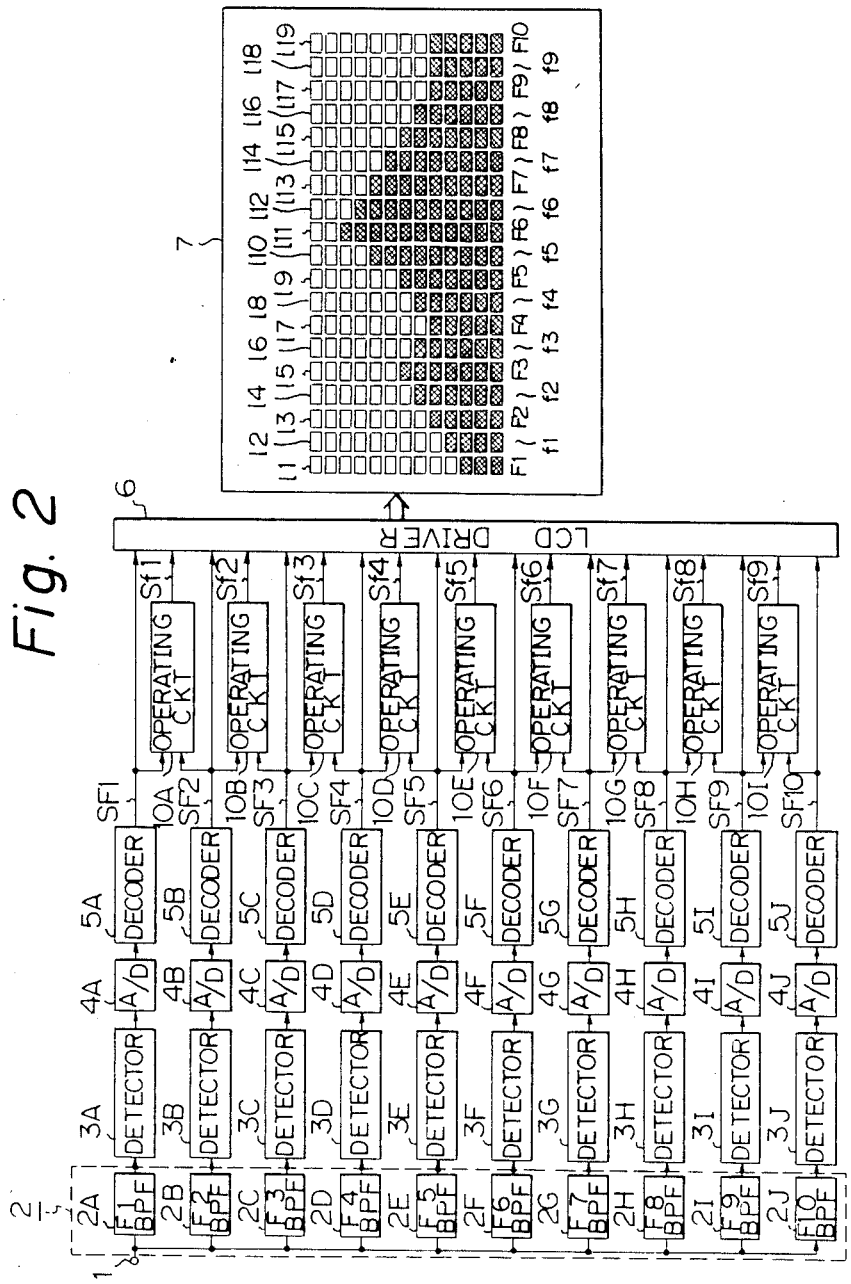
FIG. 2 is a block diagram of a spectrum analyzer according to an embodiment of the present invention.

Referring to the drawings in detail, and initially to FIG. 2 thereof, it will be seen that a graphic equalizer in accordance with an embodiment of this invention which is particularly adapted for installation in an automobile or other vehicle generally comprises an input terminal 1 through which a reproduced audio signal is supplied to a multiband band-pass filter circuit 2. The filter circuit 2 includes a number of, for example, ten, band-pass filters 2A-2J having respective pass bands with different center frequencies.

Figure 3:
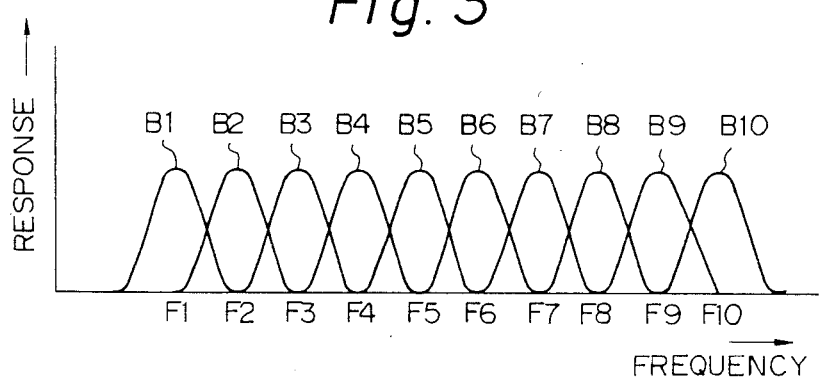
FIG. 3 is a frequency characteristic diagram showing the characteristic of a multiband band-pass filter that is included in the spectrum analyzer of FIG. 2.

In the illustrated embodiment, the band-pass filters 2A-2J constituting the multiband band-pass filter circuit 2 desirably have frequency characteristics indicated at B1-B10, respectively, on FIG. 3 so as to pass frequency bands with the center frequencies $F_1$-$F_{10}$. More particularly, the center frequencies $F_1$, $F_2$, $F_3$,—of the band-pass filters 2A, 2B, 2C,—are desirably selected to be spaced apart equally along a log scale, for example, the center frequencies may be 60 Hz, 100 Hz, 180 Hz,—respectively. In other words, the frequency ratios between the center frequencies of the adjacent frequency bands passed by the filters are approximately 1.7 to 2.0. Thus, the audio signal from the input terminal 1 is divided into ten frequency bands or components having the center frequencies $F_1$-$F_{10}$ by the ten band-pass filters 2A-2J, respectively, constituting the filter circuit 2, with such center frequencies being equally spaced apart along a log scale to conform to the conventional use of a log scale for plotting the frequencies on a frequency characteristic graph.

The outputs of the band-pass filters 2A-2J are supplied to detecting circuits 3A-3J, respectively, which detect the signal levels of the ten frequency components or bands. The detected signal level outputs from the detecting circuits 3A-3J are supplied to A/D converters 4A-4J, respectively, which provide digital data representing the signal levels of the frequency bands having the center frequencies $F_1$-$F_{10}$, respectively. The digital data from the A/D converters 4A-4J are supplied to decoders 5A-5J, respectively, in which the digital data supplied thereto and representing the signal levels of the respective divided frequency bands of the input signal are converted into decoded signals each corresponding to one of a predetermined number, for example, thirteen, steps or levels corresponding to respective dots or elements of associated bar graphs.

Figure 4:
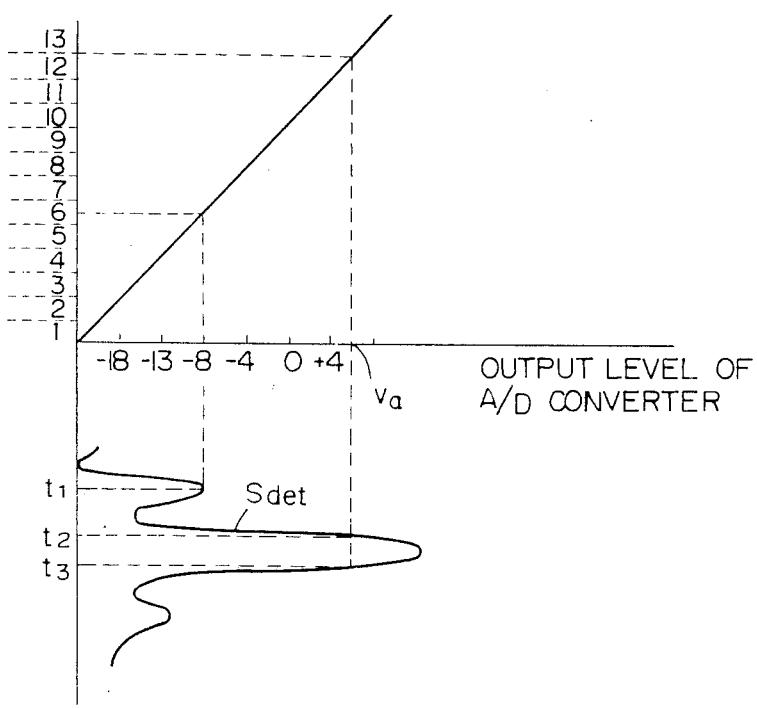
FIG. 4 is a graph to which reference will be made in explaining the operation of the spectrum analyzer according to the invention.

More specifically, and as shown on FIG. 4, if it is assumed that the detected signal level output $S_{det}$ is obtained from one of the detecting circuits 3A-3J, such detected output is digitized by the respective one of the A/D converters 4A-4J to the corresponding digital value indicated along the horizontal axis or abscissa of the graph in FIG. 4. That digital value is converted by the respective one of the decoders 5A-5J into a corresponding one of the thirteen levels or steps indicated along the vertical axis or ordinate of the graph of FIG. 4. For example, if the detected output $S_{det}$ is that indicated at the time $t_1$ on FIG. 4, such detected output is converted into a digital value corresponding to $-8$ dB by the respective one of the A/D converters 4A-4J, and is thereafter further converted into the decoded value "6" by the respective one of the decoders 5A-5J. Although the outputs of the decoders 5A-5J vary substantially linearly with the digital outputs of the A/D converters 4A-4J, respectively, such substantially linear correspondence exists only up to the digital value $V_a$. In other words, the upper limit of the decoded values or signals from the decoders 5A-5J is "thirteen" and corresponds to the digital value $V_a$, and the decoded values or signals remain at "thirteen" for any digital values above $V_a$. Thus, in the situation shown on FIG. 4, the decoded value of the detected output $S_{det}$ at each of the times $t_2$ and $t_3$ is "thirteen" for the digital value $V_a$, and the decoded value remains at "thirteen" even when the detected output is increased between the times $t_2$ and $t_3$ to provide a digital value above $V_a$.

Decoded outputs $SF_1$-$SF_{10}$ of the decoders 5A-5J are supplied through an LCD driver 6 to an LCD display device 7. As shown, the LCD display device 7 has columns $l_1$, $l_3$, $l_5$,-$l_{19}$ of dots for displaying levels of the ten frequency bands with the center frequencies $F_1$, $F_2$, $F_3$,-$F_{10}$, respectively, into which the input signal is divided by the multiband band-pass filter circuit 2, with each such column having thirteen dots therein corresponding to the increments or levels of the decoded outputs from the decoders 5A-5J.

In accordance with the present invention, the signal levels of frequency bands situated between the frequency bands divided by the filter circuit 2 are calculated, for example, by nine arithmetic operating circuits 10A–10I, from the detected signal levels of the divided frequency bands adjacent thereto, whereupon outputs $Sf_1$–$Sf_9$ of the operating circuits 10A–10I, respectively, which represent the calculated signal levels of the frequency bands between the divided frequency bands adjacent thereto, are also supplied through the LCD driver 6 for controlling the heights of bar graphs represented on the LCD display device 7 by columns $l_2$, $l_4$, $l_6$,–$l_{18}$ interspersed between the columns $l_1$, $l_3$, $l_5$,–$l_{19}$.

In the embodiment of the invention illustrated in FIG. 2, the arithmetic operating circuits 10A–10I calculate the signal levels of the frequency bands having center frequencies $f_1$–$f_9$, respectively, and which are situated between the divided frequency bands having the center frequencies $F_1$–$F_{10}$, from the decoded values or outputs $SF_1$–$SF_{10}$ of the decoders 5A–5J, respectively. More specifically, the outputs $SF_1$–$SF_2$ of the decoders 5A and 5B are supplied to the arithmetic operating circuit 10A which calculates its output $Sf_1$ as the mean value of the respective decoded outputs or levels $SF_1$ and $SF_2$. Similarly, the outputs $SF_2$ and $SF_3$ of the decoders 5B and 5C are supplied as the inputs to the arithmetic operating circuit 10B which provides the calculated value $Sf_2$ as its output; the outputs $SF_3$ and $SF_4$ of the decoders 5C and 5D are supplied to the arithmetic operating circuit 10C which provides the calculated level or value $Sf_3$ as its output; the outputs $SF_4$ and $SF_5$ of the decoders 5D and 5E are supplied to the arithmetic operating circuit 10D which provides the calculated level or value $Sf_4$ as its output; the outputs $SF_5$ and $SF_6$ are supplied from the decoders 5E and 5F to the arithmetic operating circuit 10E which provides the calculated level or value $Sf_5$ as its output; the outputs $SF_6$ and $SF_7$ are supplied from the decoders 5F and 5G to the arithmetic operating circuit 10F which provides the calculated value or level $Sf_6$ as its output; the outputs $SF_7$ and $SF_8$ are supplied from the decoders 5G and 5H to the arithmetic operating circuit 10G which provides the calculated level or value $Sf_7$ as its output; the outputs $SF_8$ and $SF_9$ are supplied from the decoders 5H and 5I to the arithmetic operating circuit 10H which provides the calculated level or value $Sf_8$ as its output; and the outputs $SF_9$ and $SF_{10}$ are supplied from the decoders 5I and 5J to the arithmetic operating circuit 10I which provides the calculated level or value $Sf_9$ as its output.

Similarly to the arithmetic operating circuit 10A, each of the arithmetic operating circuits 10B–10I calculates the mean value of the outputs of the two decoders which are input thereto. In other words, each of the arithmetic operating circuit 10A–10I executes the arithmetic operation;

$$Sf_n = (SF_n + SF_{n+1})/2$$

in which $Sf_n$ is the output from the arithmetic operating circuit, and $SF_n$ and $SF_{n+1}$ are the outputs of the two decoders which are supplied as inputs to the arithmetic operating circuit in question. The mean value $Sf_n$ of the levels $SF_n$ and $SF_{n+1}$ of the two adjacent frequency bands having the center frequencies $F_n$ and $F_{n+1}$, as obtained by each of the arithmetic operating circuits 10A–10I, substantially corresponds to the level of a frequency band which is intermediate or between the frequency bands or components having the center frequencies $F_n$ and $F_{n+1}$, respectively. Since the center frequencies $F_1$, $F_2$, $F_3$,–$F_{10}$ of the frequency bands divided from the input signal by the filter circuit 2 are selected to be equally spaced apart along a log scale, it is apparent that the mean value $Sf_n$ of the levels $SF_n$ and $SF_{n+1}$ of the two adjacent frequency bands having the center frequencies $F_n$ and $F_{n+1}$, will be the level of the frequency band having a center frequency which is midway between the frequencies $F_n$ and $F_{n+1}$ plotted on a log scale. In other words, the calculated mean value $Sf_n$ will be the level of the frequency band having the center frequency $f_n = (F_n \times F_{n+1})^{\frac{1}{2}}$.

In view of the above, when, for example, the frequencies $F_1$, $F_2$, $F_3$, $F_4$,—are selected to be 60 Hz, 100 Hz, 180 Hz, 300 Hz,—the calculated mean value $Sf_1$ obtained by the arithmetic operating circuit 10A from the levels of the frequency bands having the center frequencies $F_1$ and $F_2$, respectively, corresponds to a frequency band having the center frequency $f_1$ of 77 Hz. Similarly, the calculated mean value $Sf_2$ obtained by the arithmetic operating circuit 10B from the levels of the frequency bands having the center frequencies $F_2$ and $F_3$ corresponds to a frequency band having the center frequency $f_2$ of 134 Hz, and the calculated mean value or level $Sf_3$ provided by the arithmetic operating circuit 10C from the levels of the frequency bands having the center frequencies $F_3$ and $F_4$, respectively, corresponds to an intermediate frequency band having the intermediate frequency $f_3$ of 232 Hz.

The calculated levels $Sf_1$, $Sf_2$, $Sf_3$,–$Sf_9$ of the frequency bands having the center frequencies $f_1$, $f_2$, $f_3$,–$f_9$, respectively, and which each represent the mean value of the levels $SF_n$ and $SF_{n+1}$ of two adjacent frequency bands having the center frequencies $F_n$ and $F_{n+1}$, are supplied from the arithmetic operating circuits 10A to 10I to the LCD driver 6 for operating the respective columns $l_2$, $l_4$, $l_6$,–$l_{18}$ of the LCD display device 7.

In the particular embodiment of the invention illustrated in FIG. 2, the display device 7 is comprised of 247 dots arranged in a pattern or array consisting of nineteen columns $l_1$–$l_{19}$ arranged in succession in the horizontal direction and each consisting of thirteen dots arranged in succession in the vertical direction. The levels of the frequency components or bands having the center frequencies $F_1$, $F_2$, $F_3$,–$F_{10}$, and which are divided by the multiband band-pass filter 2, which levels are represented by the outputs $SF_1$, $SF_2$, $SF_3$,–$SF_{10}$ of the decoders 5A, 5B, 5C,–5J, respectively, are displayed as bar graphs defined by the alternate columns $l_1$, $l_3$, $l_5$,–$l_{19}$ of the LCD display device 7. On the other hand, the calculated levels of the frequency bands having the center frequencies $f_1$, $f_2$, $f_3$,–$f_9$ which are intermediate adjacent ones of the frequencies $F_1$, $F_2$, $F_3$,–$F_{10}$, are obtained as the outputs of the arithmetic operating circuits 10A, 10B, 10C,–10I, and are displayed as bar graphs represented by the columns $l_2$, $l_4$, $l_6$,–$l_{18}$, respectively, of the display device 7. Therefore, the levels of 19 successively arranged frequency components or bands are displayed as bar graphs by the liquid crystal display device 7.

Figure 5:
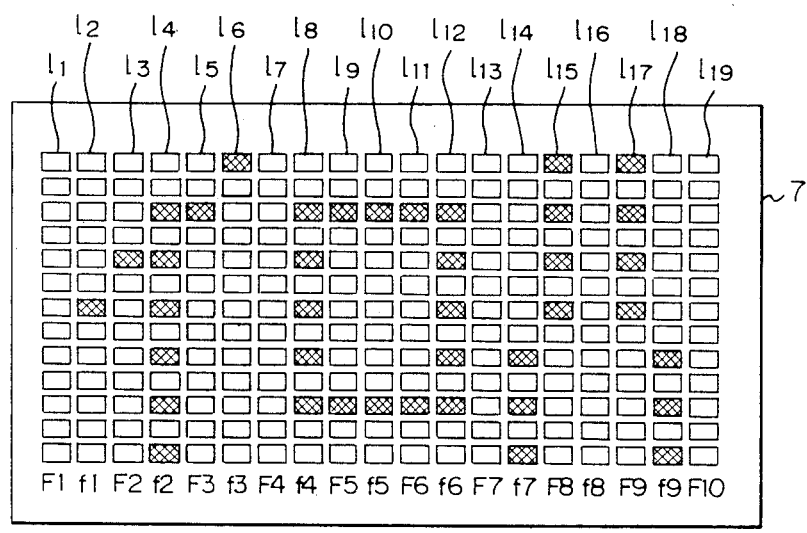
FIG. 5 is a schematic plan view of a liquid crystal display device included in the spectrum analyzer of FIG. 2, and to which reference will be made in explaining the operation thereof.

Since the LCD display device 7 is constituted by a large number of dots, for example, 247 dots as described above, such display device can also be employed for displaying characters or indicia, as indicated by the shaded areas appearing on FIG. 5. In such case, when each character is expressed by selected dots in a matrix measuring 7 dots in the vertical direction and 5 dots in the horizontal direction, the display device 7 employed in the described embodiment of the invention can be alternatively used for simultaneously displaying three characters arranged side by side, with only every other dot being used in each of the vertically arranged columns of dots.

In the above specifically described embodiment of the invention, the outputs of the adjacent ones of the decoders 5A–5J are averaged by the arithmetic operating circuits 10A–10I for obtaining the levels of the frequency bands which are intermediate the frequency bands divided by the filter circuit 2, but it will be apparent that the same results could obviously be achieved with suitable software.

Since the outputs of the adjacent ones of the decoders 5A–5G which are averaged for obtaining the level of the frequency bands intermediate the frequency bands divided by the filter circuit 2 are set to selected ones of thirteen different levels, the processes employed for obtaining the average or mean level can be relatively simplified. Furthermore, instead of averaging the outputs of the adjacent ones of the decoders 5A–5J, it is apparent that the outputs of the adjacent ones of the A/D converters 4A–4J, or the outputs of the adjacent ones of the detecting circuits 3A–3J, could be similarly averaged for obtaining the levels of the frequency bands intermediate the frequency bands divided by the filter circuit 2.

Further, although the specifically described embodiment of the invention calculates the level of only a single frequency band from the levels of the two adjacent frequency bands divided by the filter circuit 2, it will be apparent that the levels of two or more frequency bands or components between the adjacent divided frequency bands could be similarly calculated and displayed.

Moreover, instead of employing the multiband bandpass filter circuit 2 for dividing the input signal into a plurality of frequency bands or components, the input signal could be similarly divided into a plurality of frequency components or bands by an FFT (Fast Fourier Transformation).

By way of summary, it is noted that, in a spectrum analyzer according to the present invention, in addition to detecting the levels of, for example, ten frequency bands or components into which the input signal is divided by the multiband band-pass filter circuit 2, the arithmetic operating circuits 10A–10I calculate the levels of nine frequency components or bands corresponding to frequencies interspersed between the ten frequency bands divided by the filter circuit 2. Therefore, the levels of a total of nineteen different frequency components or bands can be displayed. By reason of the display of the levels of such a relatively large number of frequency bands, the frequency characteristic of the input signal can be readily and continuously recognized and such frequency characteristic can be finely adjusted. Moreover, since the increase in the number of frequency bands having their levels displayed is achieved without a corresponding increase in the number of band-pass filters included in the filter circuit 2, the size and complexity of the circuit arrangement, and hence the cost thereof, are not unduly increased. Further, since the calculated levels are determined from the levels of the adjacent frequency components or bands, the continuity of the resulting frequency characteristic appearing on the display device 7 is maintained. Furthermore, the frequency characteristic can be more readily recognized than in those cases where the number of band-pass filters included in the filter circuit 2 is increased to enable the levels of an increased number of frequency bands to be displayed.

Although a specific preferred embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A spectrum analyzer comprising:
   filter means for dividing an input signal expected to comprise a plurality of frequency components into a plurality of successive frequency bands having respective center frequencies;
   means for detecting respective signal levels of said frequency bands into which the input signal is divided;
   means for determining, from the detected signal levels of those divided frequency bands which are adjacent each other, signal levels of frequency bands situated between said adjacent divided frequency bands and having respective center frequencies disposed between the center frequencies of the divided frequency bands; and
   display means for displaying said detected signal levels of the divided frequency bands and also the signal levels which are determined for said frequency bands situated between said divided frequency bands adjacent thereto.

2. A spectrum analyzer according to claim 1; in which said display means includes means defining an array of bar graphs extending parallel to each other in succession and respectively corresponding to said detected signal levels of the divided frequency bands and said signal levels which are determined for the frequency bands situated between said divided frequency bands.

3. A spectrum analyzer according to claim 2; in which said display means includes liquid crystal display means and drive means therefor responsive to said detected and determined signal levels for causing said liquid crystal display means to define the corresponding bar graphs.

4. A spectrum analyzer according to claim 3; in which said means for determining said signal levels of the frequency bands situated between said divided frequency bands adjacent thereto include arithmetic operating means for calculating the respective signal levels.

5. A spectrum analyzer according to claim 4; in which said means for dividing the input signal includes a plurality of band pass filters having respective pass bands corresponding to said divided frequency bands and to which said input signal is supplied; said means for detecting includes level detectors connected to outputs of said band pass filters, respectively, for providing corresponding detected outputs, analog-to-digital converters for converting said detected outputs to corresponding digital signals, and decoders receiving said digital signals, respectively, and providing corresponding level-indicating values; and said arithmetic operating means calculate said signal levels of the frequency bands situated between said divided frequency bands adjacent thereto from said level-indicating values corresponding to said adjacent divided frequency bands.

6. A spectrum analyzer according to claim 5; in which said arithmetic operating means calculates said signal level of each of said frequency bands situated between said divided frequency bands as the mean value of said level-indicating values corresponding to the divided frequency bands adjacent thereto.

7. A spectrum analyzer comprising:

filter means for dividing an input signal expected to comprise a plurality of frequency components into a plurality of successive frequency bands having respective center frequencies;

means for detecting respective signal levels of said frequency bands into which the input signal is divided;

arithmetic operating means for calculating, from the detected signal levels of those divided frequency bands which are adjacent each other, signal levels of frequency bands situated between said adjacent divided frequency bands and having respective center frequencies disposed between the center frequencies of the divided frequency bands; and display means for displaying said detected signal levels of the divided frequency bands and also the signal levels which are calculated for said frequency bands situated between said divided frequency bands adjacent thereto.

8. A spectrum analyzer according to claim 7; in which said display means includes means defining an array of bar graphs extending parallel to each other in succession and respectively corresponding to said detected signal levels of the divided frequency bands and said signal levels which are calculated for the frequency bands situated between said divided frequency bands.

9. A spectrum analyzer according to claim 8; in which said display means includes liquid crystal display means and drive means therefor responsive to said detected and calculated signal levels for causing said liquid crystal display means to define the corresponding bar graphs.

10. A spectrum analyzer according to claim 7; in which said means for dividing the input signal includes a plurality of band pass filters having respective pass bands corresponding to said divided frequency bands and to which said input signal is supplied; said means for detecting includes level detectors connected to outputs of said band pass filters, respectively, for providing corresponding detected outputs, analog-to-digital converters for converting said detected outputs to corresponding digital signals, and decoders receiving said digital signals, respectively, and providing corresponding level-indicating values; and said arithmetic operating means calculate said signal levels of the frequency bands situated between said divided frequency bands adjacent thereto from said level-indicating values corresponding to said adjacent divided frequency bands.

11. A spectrum analyzer according to claim 10; in which said arithmetic operating means calculates said signal level of each of said frequency bands situated between said divided frequency bands as the mean value of said level-indicating values corresponding to the divided frequency bands adjacent thereto.

* * * * *